(12) United States Patent
Fukano et al.

(10) Patent No.: US 8,299,678 B2
(45) Date of Patent: Oct. 30, 2012

(54) SURFACE ACOUSTIC WAVE DEVICE AND METHOD FOR PRODUCTION OF SAME

(75) Inventors: Toru Fukano, Kyoto (JP); Junya Nishii, Kyoto (JP)

(73) Assignee: Kyocera Corporation, Kyoto (JP)

( * ) Notice: Subject to any disclaimer, the term of this patent is extended or adjusted under 35 U.S.C. 154(b) by 201 days.

(21) Appl. No.: 12/667,008

(22) PCT Filed: May 30, 2008

(86) PCT No.: PCT/JP2008/060081
§ 371 (c)(1),
(2), (4) Date: May 10, 2010

(87) PCT Pub. No.: WO2009/001650
PCT Pub. Date: Dec. 31, 2008

(65) Prior Publication Data
US 2010/0244625 A1    Sep. 30, 2010

(30) Foreign Application Priority Data

Jun. 28, 2007 (JP) ................................. 2007-171013

(51) Int. Cl.
*H01L 41/047* (2006.01)
(52) U.S. Cl. ............... 310/313 B; 310/313 R; 310/340; 310/344
(58) Field of Classification Search ......... 310/313 B, 310/313 R, 340, 344
See application file for complete search history.

(56) References Cited

U.S. PATENT DOCUMENTS

| | | | |
|---|---|---|---|
| 6,207,728 B1 | 3/2001 | Sekiguchi | |
| 6,710,682 B2 | 3/2004 | Onishi et al. | |
| 6,825,593 B2* | 11/2004 | Takeshima | 310/330 |
| 7,421,767 B2* | 9/2008 | Aoki | 29/25.35 |
| 7,459,829 B2* | 12/2008 | Aoki et al. | 310/313 B |
| 7,504,911 B2 | 3/2009 | Otsuka et al. | |
| 2002/0101304 A1 | 8/2002 | Onishi et al. | |
| 2007/0024397 A1 | 2/2007 | Otsuka et al. | |

FOREIGN PATENT DOCUMENTS

| | | |
|---|---|---|
| JP | 09172339 A | 6/1997 |
| JP | 09246905 A | 9/1997 |
| JP | 10270975 A | 10/1998 |
| JP | 2000109694 A | 4/2000 |
| JP | 2002261582 A | 9/2002 |
| JP | 2005123561 A | 5/2005 |
| JP | 2006128930 A | 5/2006 |
| JP | 2006333171 A | 12/2006 |

OTHER PUBLICATIONS

International search report for corresponding PCT application PCT/JP2008/60081.

* cited by examiner

*Primary Examiner* — Walter Benson
*Assistant Examiner* — Bryan Gordon
(74) *Attorney, Agent, or Firm* — DLA Piper LLP (US)

(57) ABSTRACT

A method for fabricating a small and low-profile surface acoustic wave device which can be formed collectively by a wafer process without causing deterioration in characteristics is provided. The surface acoustic wave device has a piezoelectric substrate 1, an IDT 2 formed on one major surface of the piezoelectric substrate 1 and having at least one comb-shaped electrode, and a protective cover 6 forming a hollow containing space 7 with the one major surface by covering the IDT 2 above the one major surface. The protective cover 6 is provide with a through hole 15 and composed, at least partially, of a photocurable material containing an acid generator which contains fluorine.

10 Claims, 12 Drawing Sheets

STEP A

  STEP B

  STEP C

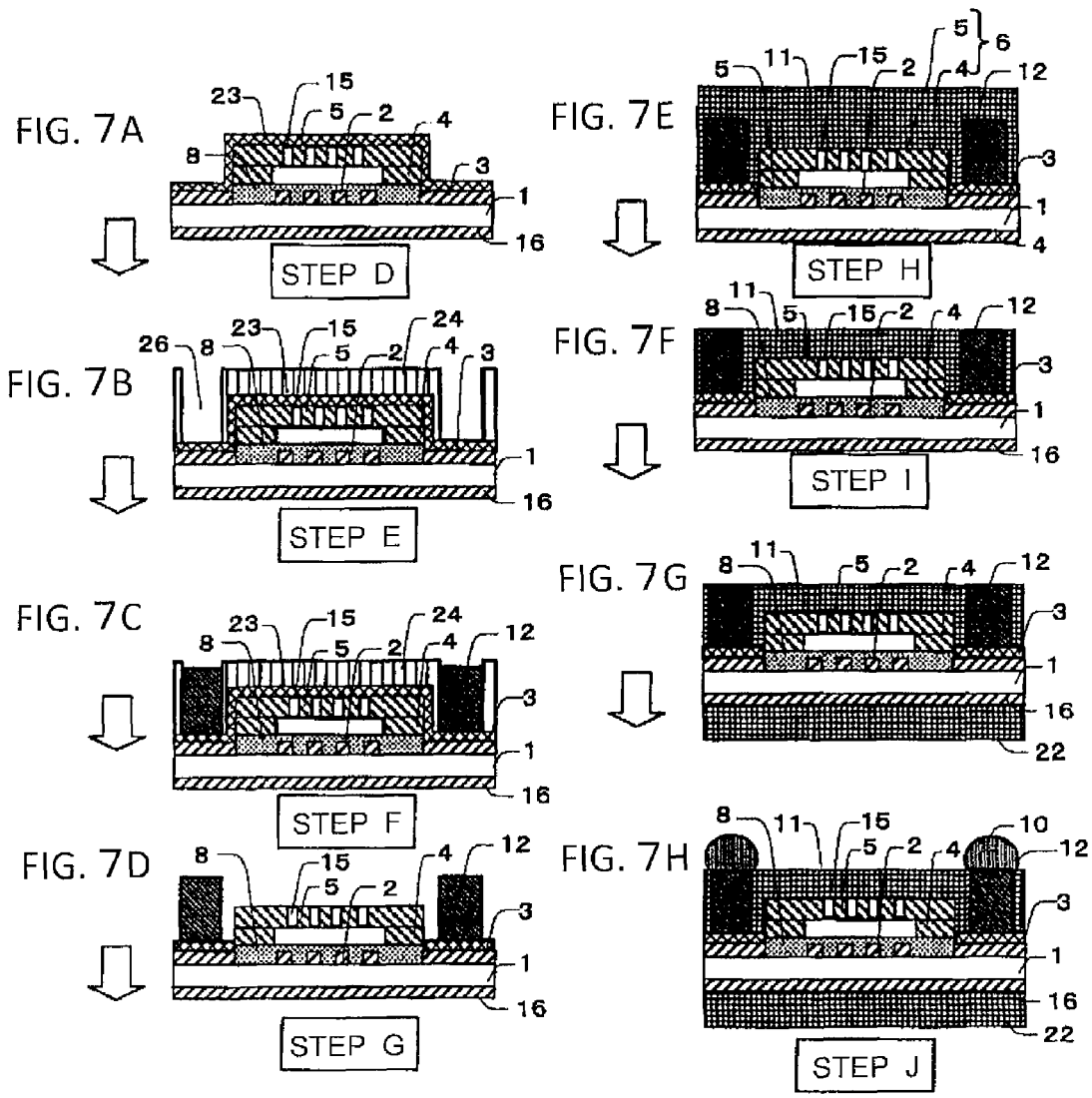

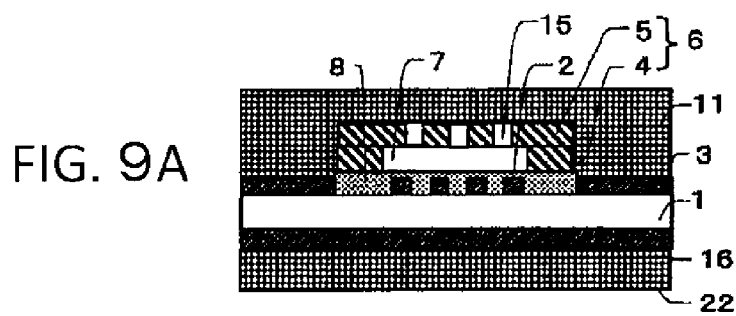
FIG. 9A  STEP K
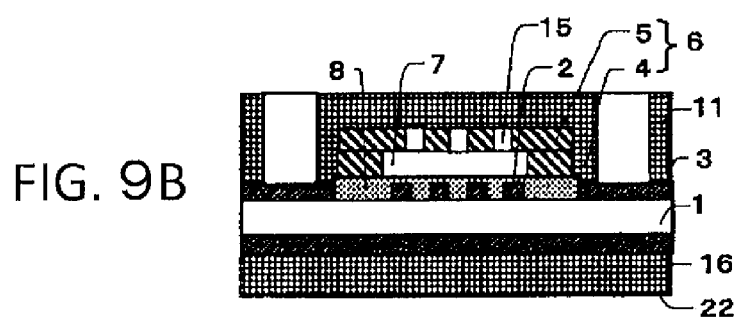
FIG. 9B  STEP L
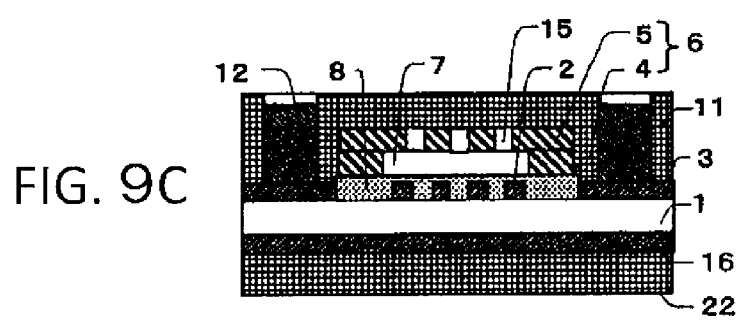
FIG. 9C  STEP M
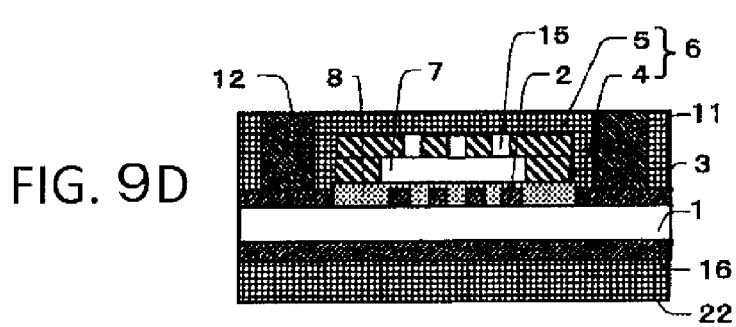
FIG. 9D  STEP I'
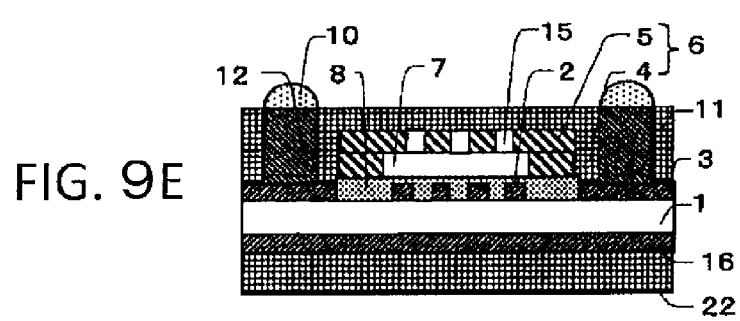
FIG. 9E  STEP J'

SURFACE ACOUSTIC WAVE DEVICE AND METHOD FOR PRODUCTION OF SAME

CROSS-REFERENCE TO THE RELATED APPLICATIONS

This application is a national stage of international application No. PCT/JP2008/060081, filed on May 30, 2008, which also claims the benefit of priority under 35 USC 119 to Japanese Patent Application No. 2007-171013, filed on Jun. 28, 2007, the entire contents of which are incorporated herein by reference.

TECHNICAL FIELD

The present invention relates to a surface acoustic wave device mainly used in a wireless communication circuit of a mobile communication device etc. and a method for production of the same, more particularly relates to a surface acoustic wave device enabling a reduction of size of a surface mountable surface acoustic wave device and even packaging in a wafer step and a method of production of the same.

BACKGROUND ART

In recent years, portable terminals used for mobile communication have been increasingly reduced in size and lightened in weight. Also with this, the portable terminals are being made multi-banded to be able to handle a plurality of communication systems and are being given more functions. Therefore, the built-in circuits have increased. For this reason, as the electronic parts used, for improvement of their mounting density, surface mountable small-size parts are being strongly demanded.

One of the key parts of a portable terminal is a surface acoustic wave device. A surface acoustic wave device is provided with a hollow portion to secure a vibration space in the vicinity of an electrode surface where a surface acoustic wave is excited. This vibration space has to be sealed air-tight. In such surface acoustic wave devices as well, together with low loss and an out-of-band cutoff characteristic, surface mountable small-sized surface acoustic wave devices are being demanded.

In response to such demands for smaller size, a surface acoustic wave device with a mounting structure of a type securing a vibration space of the surface acoustic wave by forming a protective cover so as to surround an IDT (inter digital transducer) formed on a piezoelectric substrate and exciting the surface acoustic wave has been proposed (see, for example, Patent Citation 1 and Patent Citation 2).

FIG. 8 is a cross-sectional view of principal parts showing a surface acoustic wave device disclosed in Patent Citation 1 and Patent Citation 2. As shown in FIG. 8, an IDT 52 of a surface acoustic wave element formed on a piezoelectric substrate 51 is surrounded at its periphery by a frame member 54. A lid member 55 is joined to the top of the frame member 54 to thereby form a protective cover 56. Here, 57 indicates a vibration space of the surface acoustic wave, and 53 indicates a connecting line of the IDT 52 and an external circuit. As materials of the frame member 54 and lid member 55, a film-shaped photoresist, resin sheet, etc. have been proposed.

Patent Citation 1: Japanese Patent Publication (A) No. 9-246905
Patent Citation 2: Japanese Patent Publication (A) No. 10-270975

DISCLOSURE OF THE INVENTION

Problem to be Solved by the Invention

However, as shown in FIG. 8, when forming the frame member 54, then forming the lid member 55, if at least partially using as the material of the lid member 55 a photocurable material which contains an acid generator (material) containing fluorine, since no route is secured for releasing the fluorine generated from the lid member 55, the effects of the residual fluorine will cause the IDT 52 to be damaged, so there was a problem of the electric characteristics of the surface acoustic wave device deteriorating. Note that, an acid generator containing fluorine is used in order to impart photosensitivity to the photocurable material. In general, when using a photocurable material, release of fluorine contained in the material in its exposure and curing step is not envisioned. The problem of such residual fluorine was first discovered during intensive studies by the inventors.

Accordingly, a surface acoustic wave device able to suppress the influence which fluorine generated at the time of formation of a protective cover etc. has on an IDT and a method of production of the same are preferably provided.

Means for Solving the Problem

A surface acoustic wave device of the present invention is provided with a piezoelectric substrate for propagating a surface acoustic wave, an IDT formed on one major surface of the piezoelectric substrate and provided with at least one comb-shaped electrode (interdigital electrode) having a plurality of electrode fingers (electrode digit) in a direction perpendicular to a direction of propagation of the surface acoustic wave as a longitudinal direction, and a protective cover constituted, at least partially, by a photocurable material containing an acid generator containing fluorine, having a frame surrounding the IDT and a plate-shaped lid provided on the frame, covering a region for formation of the IDT above the one major surface so as to form a hollow holding space with the one major surface, and having one or more through holes communicating the holding space with the outside.

Further, a method of production of a surface acoustic wave device of the present invention is provided with a pattern forming step of forming, on one major surface of a predetermined piezoelectric substrate, an IDT provided with at least one comb-shaped electrode having a plurality of electrode fingers in a direction perpendicular to a direction of propagation of the surface acoustic wave in the piezoelectric substrate as a longitudinal direction, a holding space forming step of providing a protective cover constituted, at least partially, by exposing and developing a photocurable material containing an acid generator containing fluorine and having a frame surrounding the IDT and a plate-shaped lid provided on the frame so as to cover a region of formation of the IDT above the one major surface and forming a hollow holding space with the one major surface, and a through hole forming step of forming a through hole in the protective cover for communicating the holding space with the outside.

Effects of the Invention

According to the present invention, the influence exerted upon the IDT by fluorine generated at the time of formation of the protective cover etc. can be suppressed.

BRIEF DESCRIPTION OF DRAWINGS

FIG. 7A to FIG. 7H are cross-sectional views of different steps of steps after FIG. 6E showing still another example of a method of production of a surface acoustic wave device of the present invention.

FIG. 9A to FIG. 9E are cross-sectional views for the different steps of the steps after FIG. 6E showing still another example of a method of production of a surface acoustic wave device of the present invention.

EXPLANATION OF REFERENCE

Figure 1A:
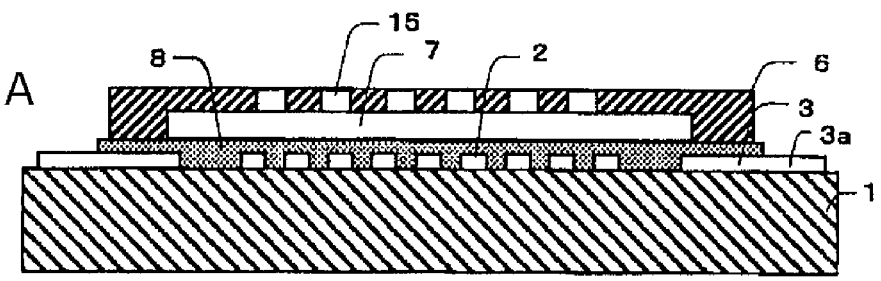
FIG. 1A and FIG. 1B are cross-sectional views showing an example of a surface acoustic wave device of the present invention.

1: piezoelectric substrate
2: IDT
3: connecting line
4: frame member
5: lid member
6: protective cover
7: hollow holding space
8: protective film
10: outside connection-use terminal electrode
11: sealing resin
12: outside connection-use electrode
15: through hole

BEST MODE FOR CARRYING OUT THE INVENTION

Below, a surface acoustic wave device of the present invention will be explained in detail based on the drawings.

Figure 10:
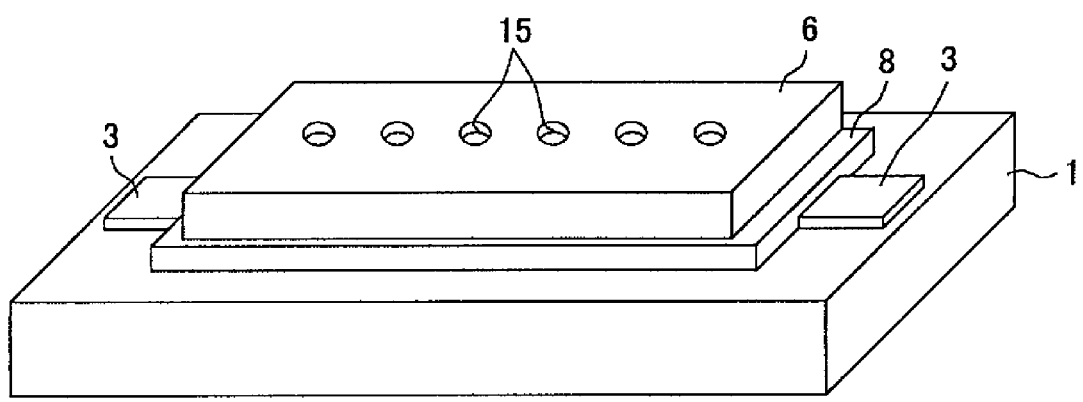
FIG. 10 A perspective view of an appearance of the surface acoustic wave device of FIG. 1A.

FIG. 1A is a cross-sectional view showing an example of a surface acoustic wave device of the present invention. Note that, in the same way for the following drawings as well, the same parts are assigned the same notations and overlapping explanations are omitted. Further, FIG. 10 is a perspective view of an appearance of the surface acoustic wave device of FIG. 1A.

In FIG. 1A, 1 indicates a piezoelectric substrate, 2 indicates an excitation electrode formed on one major surface of the piezoelectric substrate 1 as constituted by an IDT, 3 indicates a connecting line connected to the IDT 2 for connecting the IDT 2 and an external circuit, 6 indicates a protective cover constituted by a frame surrounding a region in which the IDT 2 is formed and a lid placed on the top surface thereof and covering the region in which the IDT 2 is formed, 7 indicates a hollow holding space for securing vibration of the IDT 2, 8 indicates a protective film protecting the IDT 2, and 15 indicates a through hole formed in the protective cover 6.

As, shown in FIG. 1A, the surface acoustic wave device of the present invention is provided with a piezoelectric substrate 1 propagating a surface acoustic wave, an IDT 2 (see FIG. 3 too) formed on one major surface of the piezoelectric substrate 1 and provided with at least one comb-shaped electrode constituted by a plurality of electrode fingers having a longitudinal direction in a direction perpendicular to the direction of propagation of the surface acoustic wave (left/right direction on the sheet surface in FIG. 1A), and a protective cover 6 comprised of a predetermined photocurable material, constituted by a frame surrounding the IDT 2 and a plate-shaped lid provided on the frame, and forming a hollow holding space 7 with one major surface by covering a region for formation of the IDT 2 on the one major surface. The protective cover 6 has through holes 15 for linking the holding space 7 and the outside. At least a portion of the photocurable material constituting the protective cover 6 contains an acid generator containing fluorine.

Specifically, the invention is configured as follows.

The piezoelectric substrate 1 is for example a lithium tantalite single crystal, lithium niobate single crystal, or other single crystal substrate having a piezoelectric property.

The IDT 2 is formed on one major surface of the piezoelectric substrate 1 (upper side surface in the case of the cross-section shown in FIG. 1A, hereinafter, sometimes simply referred to as the "top surface") and is comprised of a pair or several pairs of comb-shaped electrodes. The comb-shaped electrodes have pluralities of electrode fingers with longitudinal directions perpendicular to the direction of propagation of the surface acoustic wave of the piezoelectric substrate 1 and are formed so that the electrode fingers mesh with each other. The IDT 2 is formed by for example an Al—Cu alloy or other Al alloy. In order to obtain the desired characteristics, the surface acoustic wave device may be comprised connecting a plurality of IDT's 2 by a serial connection, a parallel connection, or other system so as to form a ladder type surface acoustic wave filter, a double mode surface acoustic wave resonator filter, or the like. Note that, strictly speaking, reflectors having comb-shaped electrodes provided with pluralities of electrode fingers with longitudinal directions perpendicular to the direction of propagation of the surface acoustic wave of the piezoelectric substrate 1 in the same way as the IDT 2 are provided at the two ends of an IDT 2. However, in the present embodiment, in order to simplify the explanation, the reflectors will be included in what is referred to as the IDT 2.

The connecting line 3 is a signal line formed on the piezoelectric substrate 1 and used for connecting the IDT 2 with an external circuit. The connecting line 3 is formed by, for example, an Al—Cu alloy or other Al alloy, Both of the IDT 2 and the connecting line 3 can be formed by forming an Al alloy film by a sputtering method, vapor deposition method, CVD (chemical vapor deposition) method, or other thin film forming method and patterning the Al alloy film to desired shapes by a photolithography method or the like using a reduced projection exposure apparatus (stepper) and RIE (reactive ion etching) apparatus.

The protective cover 6 is a member which is constituted by a frame surrounding the IDT 2 and a plate-shaped lid provided on the frame and which is provided on the piezoelectric substrate 1 so as to cover the region for formation of the IDT 2 so that a hollow holding space 7 containing the IDT 2 is formed together with the piezoelectric substrate 1 by. Here, the holding space 7 is a space secured as a vibration space of the electrode fingers of the IDT 2. The size thereof is, for example, 500 μm (in direction along piezoelectric substrate 1)×500 μm (in other direction along piezoelectric substrate 1)×30 μm (in direction perpendicular to piezoelectric substrate 1). For the formation of the protective cover 6, use is made of a material with which a sufficient joint is realized with the piezoelectric substrate 1. For example, an epoxy-based resin, polyimide resin, BCB (benzocyclobutene), acrylic resin, or other negative-type photocurable material can be used as the principal material.

Here, at least a portion of the protective cover 6 is formed by a material mixed with an acid generator. Here, the "acid generator" is a substance sensitive to irradiation of light or heating and generating protons ($H^+$). For example, use of triarylsulfonium hexafluoroantimonate is a preferred example. Other than this, benzoin tosylate, benzoin mesylate, pyrogallol tritosylate, pyrogallol trimesylate, tri(nitrobenzyl) phosphate, trianisoline phosphate, diaryl iodonium salt, triaryl sulfonium salt, or the like can be applied too. The protective cover 6 is comprised of a material containing, among such acid generators, for example, at least one type of acid generator containing fluorine such as triarylsulfonium hexafluoroantimonate. Note that, as the acid generator, there are ones which do not contain fluorine as well. However, in order to promote polymerization by irradiation of light, preferably use is made of an acid generator containing fluorine able to generate a strong acid. Here, the acid generator explained above may be provided in only the frame of the protective cover 6, may be provided in only the lid, or may be provided in only a portion of each. Further, it may be given to the entire material forming the protective cover 6 as well.

Figure 2:
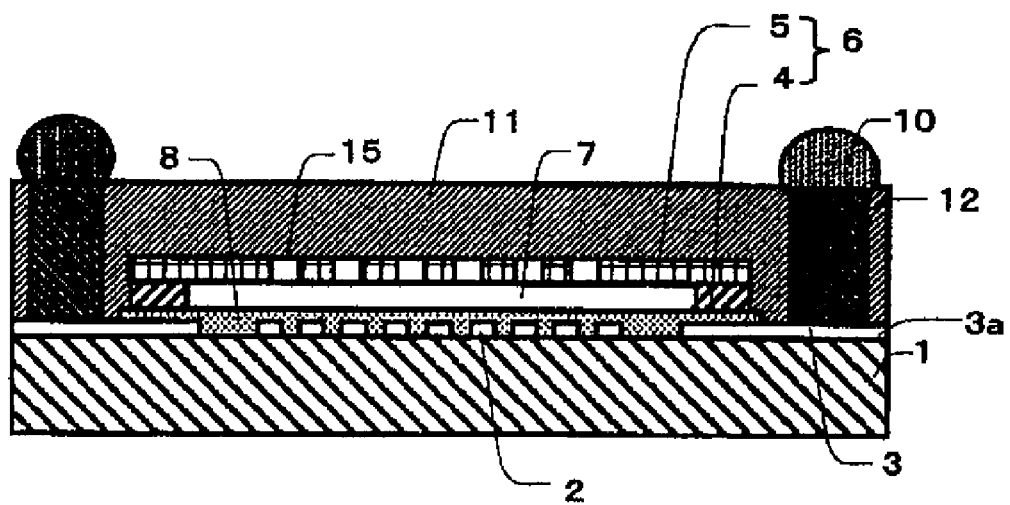
FIG. 2 A cross-sectional view showing an example of the surface acoustic wave device of the present invention.

Further, parts of this protective cover 6 are provided with through holes 15. The through holes 15 preferably have a size of about several micrometers to about 50 μm in order to stably hold the holding space 7. Note that, when considering the escape of the residual fluorine gas and washability of the inside of the holding space 7, preferably a plurality of (for example, two or more) through holes 15 are formed per holding space 7. Further, the size of the through holes 15 is preferably set to about several micrometers to about 50 μm also in a case when considering closing them by a later explained sealing resin 11 as shown in FIG. 2 in order to air-tightly seal the IDT 2. Such through holes 15 may be provided by, for example, patterning simultaneously with the formation of the frame and lid or may be provided by removing portions by etching or the like after forming the frame and lid.

Note that, FIG. 1A and FIG. 10 illustrate a case where a smaller number of circular through holes 15 of than the plurality of electrode fingers arranged on a line along the direction of arrangement of the plurality of electrode fingers. However, the shape of the through holes 15 may be circular, rectangular, elongated (slit shaped), or otherwise suitably set. The number of through holes 15 may be the same as the number of the electrode fingers or may be larger than the number of the electrode fingers. The plurality of through holes 15 may be arranged in two lines or more, irregularly arranged, or otherwise arranged two-dimensionally.

By configuring the invention in this way, the through holes 15 of the protective cover 6 are used to secure paths through which fluorine filled inside of the protective cover 6 (in the holding space) in the fluorine generated from the protective cover 6 can be released to the atmosphere and enable the inside of the space to be washed. Due to this, occurrence of damage to the IDT 2 is suppressed, deterioration in electric characteristics of the surface acoustic wave device can be suppressed, and a small-sized surface acoustic wave device excellent in long term reliability can be realized.

Further, by providing the protective cover 6 above the piezoelectric substrate 1, a ceramic package etc. for holding the surface acoustic wave device becomes unnecessary, so a small-sized surface acoustic wave device can be provided.

Note that, as shown in FIG. 1A, a connecting line 3 formed on one major surface of the piezoelectric substrate 1, connected to the IDT 2, having an end portion 3a outside of the protective cover 6, and used for electrically connecting the IDT 2 and an external circuit may be provided as well. Due to this, it becomes possible to connect the IDT 2 and an external circuit in a state sealing the IDT 2.

Note that, in the cross-sectional view shown in FIG. 1A, the IDT 2 is shown so that a cross-section vertical to the longitudinal direction of the IDT 2 is, shown (so that the direction vertical to the drawing coincides with the longitudinal direction of the electrode fingers), and the connecting line 3 is shown so that its cross-section is shown as well. However, the arrangement between the IDT 2 and the connecting line 3 in the surface acoustic wave device is not limited to a mode satisfying such a state. Further, FIG. 1 shows a case of a mode where the connecting line 3 is provided to reach the side end of the piezoelectric substrate 1, but the invention is not necessarily limited to such a mode of arrangement. Note that, if the end portion 3a at the side of the connecting line 3 which is not connected to the IDT 2 is given a wider width in comparison with the side which is connected to the IDT 2 and the line width at the position where the frame of the protective cover 6 is arranged when viewed from the top, connection with an external circuit becomes easy, so this is preferred.

Further, as shown in FIG. 1, the protective film 8 may be provided to cover the IDT 2 as well. By the protective film 8, direct contact of the IDT 2 and fluorine in the holding space 7 can be suppressed, so a surface acoustic wave device with a higher reliability can be provided. Note that, the protective film 8 can suppress contact of fluorine and the IDT 2, but is formed thin so that the influence exerted upon the surface acoustic wave is suppressed, therefore does not completely prevent contact of fluorine and the IDT 2. For this reason, preferably the IDT 2 is protected by both of the through holes 15 of the protective cover 6 and the protective film 8. The thickness of the protective film 8 is, for example, 1/10 of the thickness of the electrode fingers. For example, when the thickness of the electrode fingers is 100 to 200 nm, the thickness of the protective film 8 is 10 to 20 nm.

Further, as shown in FIG. 1, preferably the protective film 8 is extended also at the position where the frame of the protective cover 6 is arranged. By employing such a configuration, direct contact of the connecting line 3 and the protective cover 6 can be prevented. The protective cover 6 is formed by promotion of polymerization by the acid generator. However, if the protective cover 6 and a conductive material contact, the protons generated by the acid generator will be absorbed by the conductive material, so the polymerization at the portion contacting the conductive material is liable to become insufficient. Contrary to this, by employing the configuration of FIG. 1, contact of the conductive material constituting the connecting line 3 with the protective cover 6 can be prevented, therefore the protective cover 6 can be stably formed, and the protective cover 6 can be made to tightly contact the piezoelectric substrate 1 (with the protective film 8 formed on the piezoelectric substrate 1).

For the protective cover 8, use is made of a material which has an insulation property and is light enough in weight to an extent where it does not exert an influence upon a propagated surface acoustic wave. For example, use is made of silicon oxide, silicon nitride, or silicon. Such a material may be formed by for example the CVD method.

Figure 1B:
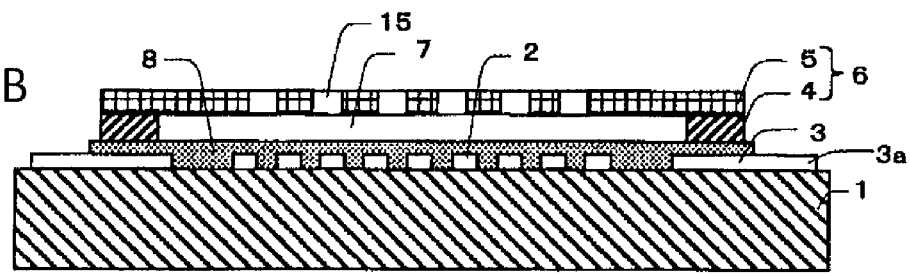

Further, as shown in FIG. 1B, in the surface acoustic wave device of the present invention, in the constitution described above, the protective cover 6 may be formed by joining the frame member 4 forming the frame and the film-shaped lid member 5 placed on the frame member 4 forming the lid as well. Due to this, in the same way, a path through which the fluorine is released into the atmosphere is secured by the through holes 15 of the protective cover 6, therefore a small-sized surface acoustic wave device excellent in long term reliability without causing damage to the IDT 2 and without causing deterioration in electric characteristics of the surface acoustic wave device can be realized. Further, it becomes possible to reliably secure a vibration space (holding space 7) above the surface acoustic wave element region by a simple process. Further, when the frame member 4 contains an acid generator containing fluorine, the exposure and curing step releasing fluorine is carried out in a state where the lid member 5 does not exist, therefore the lid member 5 can be formed after reducing the fluorine released from the frame member 4. Due to this, the fluorine remaining in the holding space 7 can be reduced, and a surface acoustic wave device with a higher reliability can be provided.

Note that, the frame member 4 and the lid member 5 may be formed by different materials as well. However, if considering tight contact of the two and forming these by the same material, the strength of the protective cover 6 can be secured and a protective cover 6 having no clearance etc. at the joint part of the two can be formed, so this is preferred.

Further, when using a film-shaped lid member as the lid member 5 as in FIG. 1B, polymerization must be promoted while maintaining the film shape. Therefore, in comparison with the case shown in FIG. 1A, a stronger acid must be generated. For this reason, the acid generator containing fluorine becomes higher in importance, and, along with that, the through holes 15 become higher in importance.

FIG. 2 is a cross-sectional view showing an example of the surface acoustic wave device of the present invention. In FIG. 2, 10 indicates an outside connection-use terminal electrode, 11 indicates a sealing resin, and 12 indicates an outside connection-use electrode.

The surface acoustic wave device shown in FIG. 2 is provided with, in addition to the configuration of FIG. 1B, a substantially columnar outside connection-use electrode 12 on the end portion 3a of the connecting line 3. The upper end portion of the outside connection-use electrode 12 is exposed, and the through holes 15 are closed and the protective cover 6 and the outside connection-use electrode 12 are sealed using the sealing resin 11. Due to this, deterioration of the IDT 2 can be prevented in the same way. Further, by sealing by resin in a state where the vibration space (holding space 7) of the IDT 2 is secured, the space is air-tightly sealed and invasion of moisture from the outside can be suppressed, therefore the reliability becomes higher. Further, surface mountings becomes possible by the substantially columnar outside connection-use electrode 12, so handling becomes easy.

Figure 3:
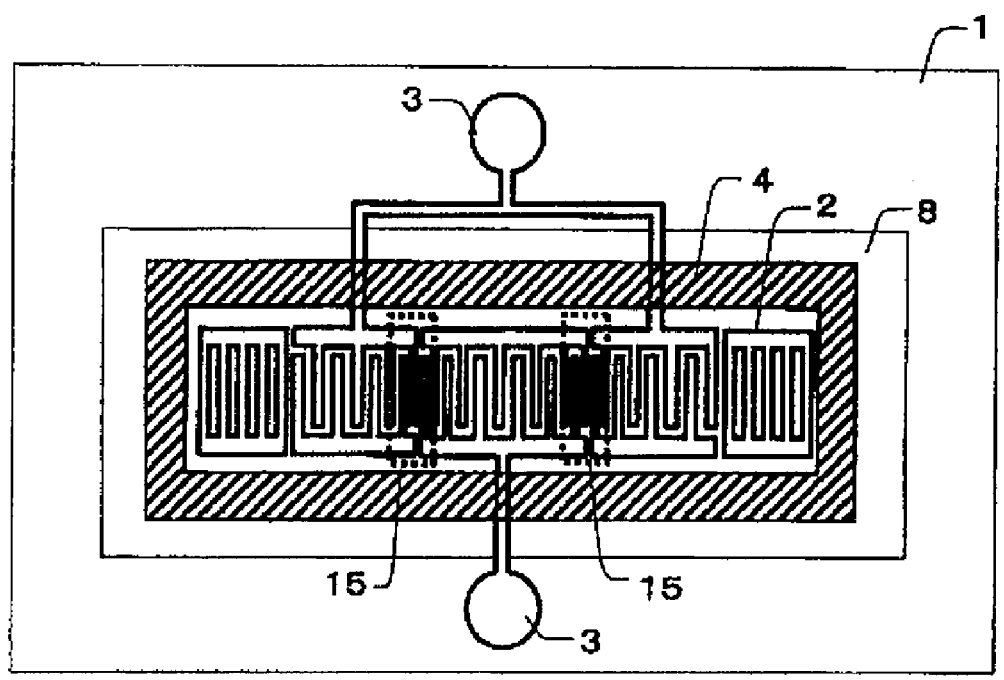
FIG. 3 A see-through view showing an example of the surface acoustic wave device of the present invention.
Figure 11:
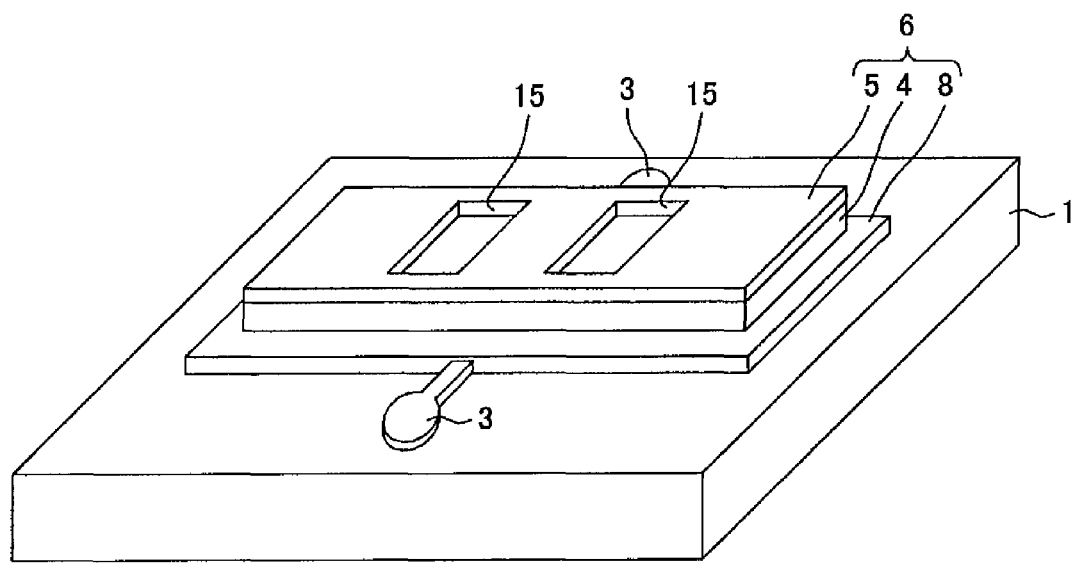
FIG. 11 A perspective viewed of an appearance of the surface acoustic wave device of FIG. 3.

FIG. 3 is a see-through plan view showing an example of the surface acoustic wave device of the present invention. FIG. 11 is a perspective view of an appearance of the surface acoustic wave device of FIG. 3.

In FIG. 3, the position of arrangement of the frame member 4 is shown by hatching so that the position of arrangement becomes clear. Further, the lid member 5 is arranged above the frame member 4 and a region surrounded by the frame member 4. The positions of arrangement of the through holes 15 provided in the lid member 5 are indicated by dotted lines.

The configuration shown in FIG. 3 and FIG. 11 differ from the configuration shown in FIG. 1B in only positions of provision of the through holes 15, therefore below only the different portions will be explained.

In FIG. 3, the through holes 15 are formed at positions facing a region (narrow pitch region) in which the interval of the electrode fingers of the IDT 2 becomes narrow in comparison with the interval of the electrode fingers at the periphery. In the narrow pitch region of the electrode fingers of the IDT 2, the line width itself of the electrode fingers becomes narrow. Therefore, in a case where there is residual fluorine, damage to the electrode fingers of the IDT 2 conspicuously appears due to reaction with the fluorine. For example, when the IDT 2 is made of aluminum, not only are the electric characteristics deteriorated due to the aluminum fluoride formed by reaction with the fluorine, but also the volume expands due to the reaction and electrode fingers which are adjacent to each other sometimes contact each other. However, by providing the through holes 15 at a location facing the narrow pitch region in the lid member 5, that is, at a portion right above the narrow pitch region, the influence thereof can be suppressed, so a surface acoustic wave device excellent in long term reliability can be provided.

Further, as shown in FIG. 3, even in the case of providing the protective film 8, it is effective to provide the through holes 15 in order to prevent invasion of fluorine from a portion where the protective film 8 is not formed or a crack or other defective portion and to make the positions thereof the positions shown in FIG. 3. This is because, in the region where the interval of electrode fingers of the IDT 2 becomes narrower, electric charges are liable to build up due to the pyroelectricity of the piezoelectric substrate 1, so the possibility of sparking and causing a defect in the protective film 8 is high. In this way, by providing the through holes 15 in a portion facing the position where a possibility that the IDT 2 will be exposed from the protective film 8 due to sparks is higher in comparison with the other portion and releasing the fluorine remaining inside the holding space 7, a surface acoustic wave device with a higher reliability can be provided.

Note that, in FIG. 3 and FIG. 11, the case where the through holes 15 are formed in rectangular shapes is exemplified, but the shapes etc. of the through holes 15 may be appropriately set as explained above.

Figure 4:
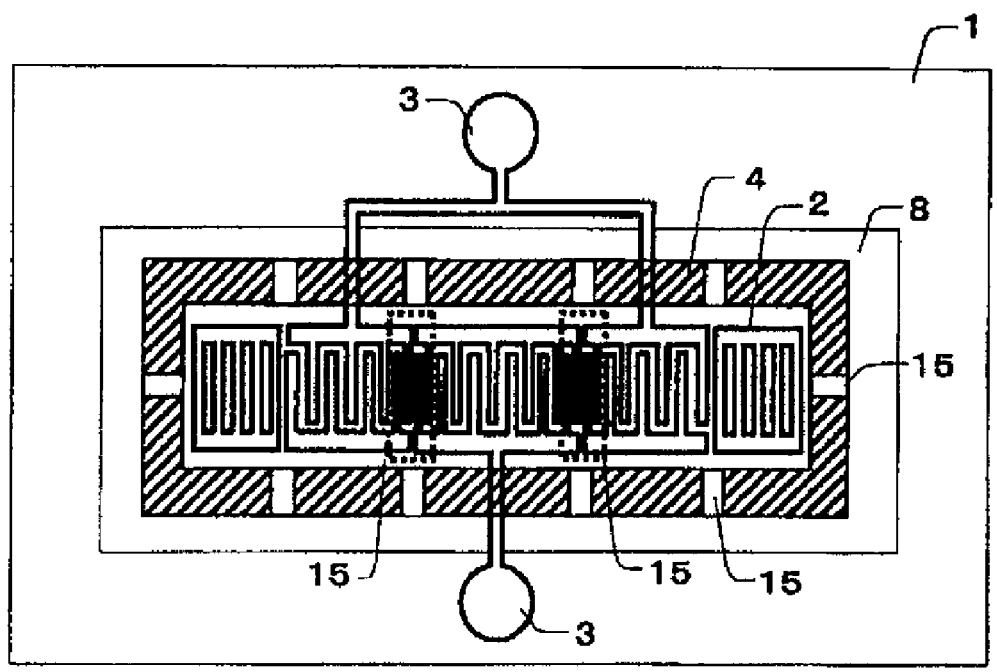
FIG. 4 A see-through view showing an example of the surface acoustic wave device of the present invention.
Figure 12:
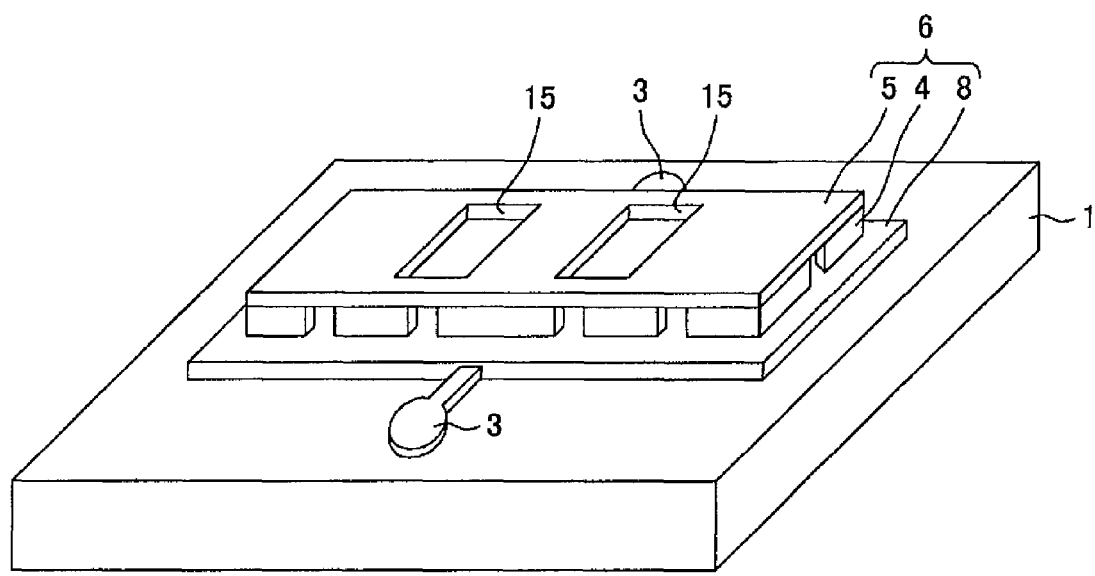
FIG. 12 A perspective view of an appearance of the surface acoustic wave device of FIG. 4.

FIG. 4 is a see-through plan view showing an example of the surface acoustic wave device of the present invention. FIG. 12 is a perspective view of the appearance of the surface acoustic wave device of FIG. 4. In the same way as FIG. 3, the position of arrangement of the frame member 4 is shown by hatching. In FIG. 4 as well, the configuration differs from the configuration shown in FIG. 1B in only the positions of provision of the through holes 15, so below only the different parts will be explained.

In FIG. 4, the frame member 4 has clearances at portions of the shape surrounding the IDT 2 when viewed from the top. The clearances are used as the through holes 15.

Due to this, fluorine can be released through the through holes 15 of the frame member 4, therefore a small-sized surface acoustic wave device suppressing occurrence of damage of IDT 2, resistant to deterioration of electric characteristics of the surface acoustic wave device, and excellent in long term reliability can be realized. Further, in a case where the through holes 15 are formed in a portion of the lid member 5 and the frame member 4, after forming the protective cover 6, a rinsing step is used to secure a flow path, positive elimination of fluorine becomes easy, and damage of the IDT 2 due to fluorine can be reduced. In particular, when the frame member 4 is provided with through holes 15, in comparison with the case where only the lid member 5 is formed with through holes 15, the moisture at the time of rinsing can be discharged without remaining on the bottom of the holding space 7, therefore the reliability can be raised more. The size in the thickness direction of the through holes 15 provided in the frame member 4 (diameter in the direction perpendicular to the major surface of the piezoelectric substrate 1) is preferably made a size of the same extent as the thickness of the frame member 4 (height, the size in the direction perpendicular to the major surface of the piezoelectric substrate 1) so as to expose the piezoelectric substrate 1 of the frame member 4 or the protective film 8 provided above the piezoelectric substrate 1. This is for keeping moisture at the time of rinsing from remaining at the bottom portion of the holding space 7. In FIG. 4, the example where both of the lid member 5 and the frame member 4 were formed with through holes 15 was shown, but use may also be made of a protective cover 6 configured with through holes 15 formed in only the frame member 4. Further, in FIG. 12, the case where the through holes 15 formed in the frame member 4 were formed in rectangular shapes was exemplified, but the shape etc. of the through holes 15 may be appropriately set as explained above.

Note that, as shown in FIG. 4, by providing the through holes 15 arranged in the frame member 4 so as to become paired at positions facing each other when viewed on a plane in the shape surrounding the region where the IDT 2 is formed, the flow path at the time of rinsing becomes one with a smaller resistance, so this is preferred. The through holes 15 are preferably given a size of about several micrometers to about 50 μm when viewed from the top in a case when provided in the lid member 5 and when viewed from a side view when provided in the frame member 4.

Next, the method of production of the surface acoustic wave device of the present invention will be explained in detail based on the drawings.

FIGS. 5A to 5E are cross-sectional views of the steps showing an example of the method of production of a surface acoustic wave device of the present invention.

In FIG. 5, 16 indicates a back surface electrode formed on the bottom surface of the piezoelectric substrate.

Next, each step will be explained.

(Step A: Patterning Step)

Figure 5A:
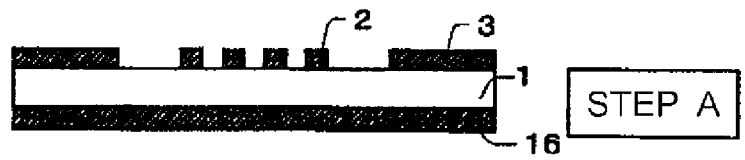
FIG. 5A to FIG. 5E are cross-sectional views of different steps showing an example of a method of production of a surface acoustic wave device of the present invention.

As shown in FIG. 5A, first, on a predetermined major, surface of the piezoelectric substrate 1, an IDT 2 provided with at least one comb-shaped electrode comprised of a plurality of electrode fingers having a longitudinal direction in a direction perpendicular to the direction of propagation of the surface acoustic wave in the piezoelectric substrate 1 and a connecting line 3 which is connected to the IDT 2 and electrically connects the IDT 2 and an external circuit are formed.

Specifically, on one major surface of a piezoelectric substrate 1 comprised of, for example, a lithium tantalate single crystal, a lithium niobate single crystal, or other single crystal having a piezoelectric property, the excitation electrode for generating the surface acoustic wave, that is, the IDT 2, and the connecting line 3 connected to the IDT 2 are formed. These IDT 2 and connecting line 3 are comprised of, for example, an Al—Cu alloy or other Al alloy. The IDT 2 and the connecting line 3 are obtained by forming a thin film by a sputtering method, vapor deposition method, CVD method, or other formation method and patterning it by the photolithography method or the like using a reduced projection exposure apparatus (stepper) and RIE (reactive ion etching) apparatus to obtain the desired shapes.

In this way, the region in which the IDT 2 and the connecting line 3 are formed on the piezoelectric substrate 1 is made the surface acoustic wave element region.

Further, the back surface electrode 16 is comprised of, for example, an Al—Cu alloy or other Al alloy. The back surface electrode 16 is formed by a sputtering method, vapor deposition method, CVD (chemical vapor deposition) method, or other thin film forming method. The back surface electrode 16 is formed on the entire back surface of the piezoelectric substrate. Due to this, it becomes possible to ground electric charges charged in the front surface of the piezoelectric substrate due to temperature changes, and problems such as breakage of the piezoelectric substrate due to sparking and sparks between electrodes can be prevented.

Figure 5B:
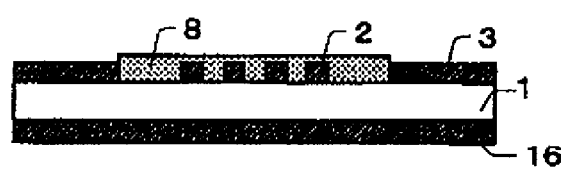

Next, as shown in FIG. 5B, in order to prevent oxidation etc. of the IDT 2 etc., the IDT 2 and the connecting line 3 are covered by the protective film 8 comprised of silicon oxide, silicon nitride, silicon, or the like. The protective film 8 is formed by a CVD method or vapor deposition method or other thin film formation method. Further, in order to connect this with an external circuit, the photolithography method is used to remove a portion of the protective film 8 so that at least a portion (end portion) of the connecting line 3 is exposed.

(Step B: Holding Space Forming Step 1)

Figure 5C:

Next, as shown in FIG. 5C, in a portion above the surface acoustic wave element region, a sacrificial layer 7a is formed. The sacrificial layer 7a is a layer which is formed once and is removed at a later step by etching or dissolution or other treatment. The sacrificial layer 7a can be formed by, for example, silicon dioxide or other silicon oxide, amorphous silicon, a photoresist, or another polymer material. Here, a case where the sacrificial layer 7a is formed by silicon dioxide will be explained.

In such a case, the sacrificial layer 7a can be formed by a method of formation by a plasma CVD method using TEOS (tetraethyl orthosilicate), TEB (tetraethyl borate), TMOP (tetramethyl oxyphosphate), or other starting material gas, a method using a vacuum method such as the sputtering method, or another method.

Alternatively, it is also possible to utilize the photosensitivity of polysilane to form the sacrificial layer 7a. Polysilane is a silicon-based polymer in which silicon (Si) atoms are connected in a chain state. By irradiating this with UV-rays, the Si—Si bonds are decomposed by light, so siloxane bonding portions in which oxygen atoms are arranged between silicon bonds or silanol groups acting as acid sites are formed. When immersing this in an alkali developer, the portions at which silanol groups are formed dissolve in the developer. Namely, by selectively forming the parts exposed by the UV-rays, it is possible to remove only the exposed portions by dissolution and therefore possible to form any planar shape. After development, by irradiating UV-rays having a sufficient strength again to expose the entire surface, then heating it in an oxygen atmosphere again, oxygen atoms enter into portions in which silicon bonds are cut due to reaction with the UV-rays, whereby a silicon oxide film is formed. Note that, as modifying groups modified in the side chain of the polysilane, a variety of groups such as propyl groups, hexyl groups, phenylmethyl groups, trifluoropropyl groups, nonafluorohexyl groups, tolyl groups, biphenyl groups, phenyl groups, and cyclohexyl groups can be appropriately selected.

Further, when using amorphous silicon to form the sacrificial layer 7a, it is possible to form this by a method of formation by the plasma CVD method by using $H_2$, $SiH_4$, or another starting material gas, a method using the sputtering method or other vacuum process, or other method.

Figure 5D:
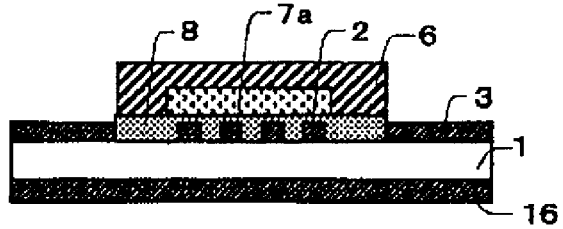
Figure 5E:
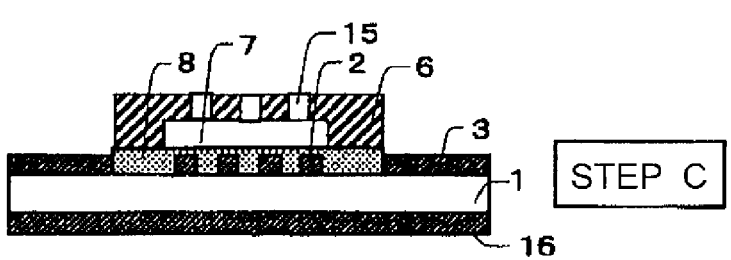

After forming the sacrificial layer 7a, an epoxy-based resin or polyimide resin, BCB (benzocyclobutene), or an acrylic resin or other negative type photosensitive resist is used by a spin coating method or other technique to cover the sacrificial layer 7a as shown in FIG. 5D. By exposing and developing this, the protective cover 6 is formed. At that time, at least a portion of the protective cover is made to contain an acid generator containing fluorine. A mode where the entire protective cover 6 is formed by a photosensitive resist containing an acid generator containing fluorine is also possible.

Further, in FIG. 5D, the frame of the protective cover 6 is formed on the protective film B. Due to this, even in the case where the frame of the protective cover 6 has an acid generator, it will not absorb protons generated when the acid generator is cured as in the electrode material, therefore curing advances well even between the frame of the protective cover 6 and the protective film 8, and the reliability of the joint is improved, so this is preferred.

(Step C: Holding Space Forming Step 2, Through Hole Forming Step)

Further, by performing the through hole forming step forming the through holes 15 in this protective cover 6 and then performing a sacrificial layer removing step removing the sacrificial layer 7a through the through holes 15, as shown in FIG. 2E, the holding space 7 serving as the vibration space of the IDT 2 is formed between the protective cover 6 and the piezoelectric substrate 1.

The through holes 15 may be formed by patterning by a usual photolithography method. In the through holes 15, the vertical cross-sectional shape preferably becomes a tapered state in which an opening on the holding space 7 side becomes narrow. Due to this, when forming the sealing resin 11, it becomes harder for the sealing resin 11 to enter into the holding space 7 from the through holes 15.

As the method of removing the sacrificial layer 7a via the through holes 15, when forming the sacrificial layer 7a by amorphous silicon, the technique of selective etching by dry etching or wet etching can be applied. For example, the sacrificial layer can be removed by the dry etching using $XeF_2$ (xenon fluoride gas), wet etching using fluoro-nitric acid, or the like. Further, when forming the sacrificial layer 7a by silicon dioxide, a technique such as dry etching by fluoric acid vapor or wet etching by immersion in a buffer fluoric acid can be utilized.

The holding space forming step is comprised of these step B and step C. Note that, the through holes 15 may be formed by patterning simultaneously at the time of exposure, development, and patterning of the protective cover. In this way, it is not necessarily required to perform the holding space forming step and the through hole forming step in this order.

By going through the above steps, a surface acoustic wave device prevented from deterioration in electric characteristics and excellent in long term reliability as shown in FIG. 1A can be fabricated.

Next, another example of the method of production of the surface acoustic wave device of the present invention will be explained by using FIG. 6. In FIGS. 6, 17 indicates a second resist. Note that, FIG. 6 are the same as FIG. 5 in the step A portion, therefore an overlapping explanation will be omitted and a step B' (FIGS. 6C to 6D) and step C' (FIG. 6E) which are different from FIG. 5 will be explained.

(Step B': Holding Space Forming Step)

Figure 6A:
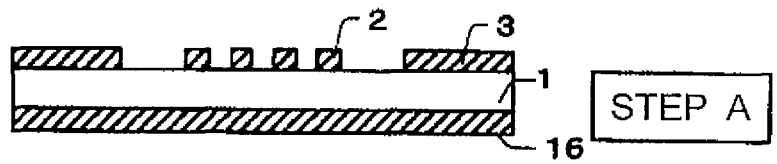
FIG. 6A to FIG. 6E are cross-sectional views of different steps showing another example of a method of production of a surface acoustic wave device of the present invention.
Figure 6B:
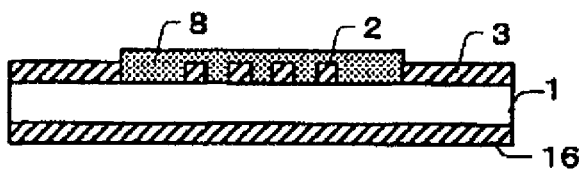
Figure 6C:
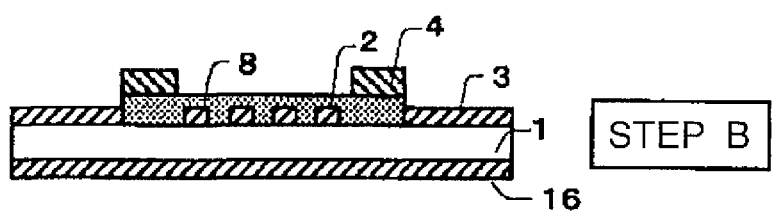

As shown in FIG. 6C, the frame member 4 surrounding the IDT 2 is formed by a first resist comprised of a predetermined photocurable material (frame forming step). As the first resist, use can be made of, for example, an epoxy-based resin or polyimide resin, BCB (benzocyclobutene), or an acrylic resin. The first resist is formed on the surface acoustic wave element region of the piezoelectric substrate 1 by for example the spin coating method or printing method. Next, an exposure and development step is used to form the first resist to a frame member 4 surrounding the region in which the IDT 2 is formed. Here, the frame member 4 may be given a thickness of several micrometers to about 30 μm. In particular, when considering bending etc. of the lid member 5 provided in the later step, a thickness of 10 μm or more is preferred so that the lid member 5 and the bottom surface of the holding space will not contact.

Further, in FIG. 6C, the frame member 4 is formed on the protective film 8. Due to this, even when the frame member 4 has an acid generator, the protons which are generated when the acid generator is cured as in an electrode material will not be absorbed, therefore curing will advance well even between the frame member 4 and the protective film 8, and the reliability of the joint will be improved, so this is preferred.

Figure 6D:
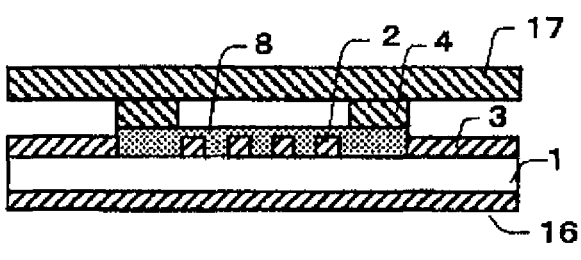

Next, as shown in FIG. 6D, by providing the protective cover 6 constituted by the plate-shaped lid member 5 provided on the frame member 4 so as to cover the region for formation of the IDT 2 on one major surface, a hollow holding space 7 comprised by one major surface is formed (lid forming process). Specifically, a film-shaped second resist 17 is placed on the top surface of the frame member 4 to cover the region where the IDT 2 is formed. As the second resist 17, use can be made of, for example, an epoxy-based resin or polyimide resin, BCB (benzocyclobutene), or acrylic resin. This second resist 17 has a film shape. By just placing the second resist on the top surface of the frame member 4, a space can be formed with the piezoelectric substrate 1. To place the second resist 17, it is possible to use an adhering machine to adhere it to the top surface of the frame member 4.

(Step C': Through Hole Forming Step)

Figure 6E:
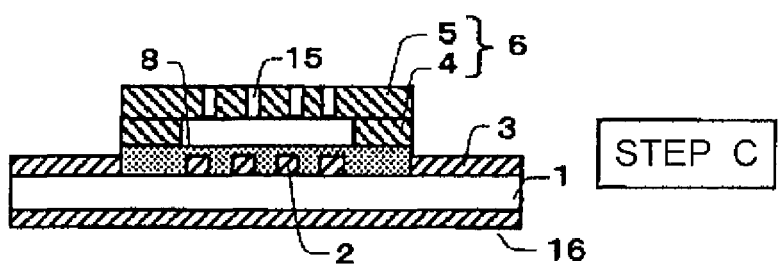
Figure 8:
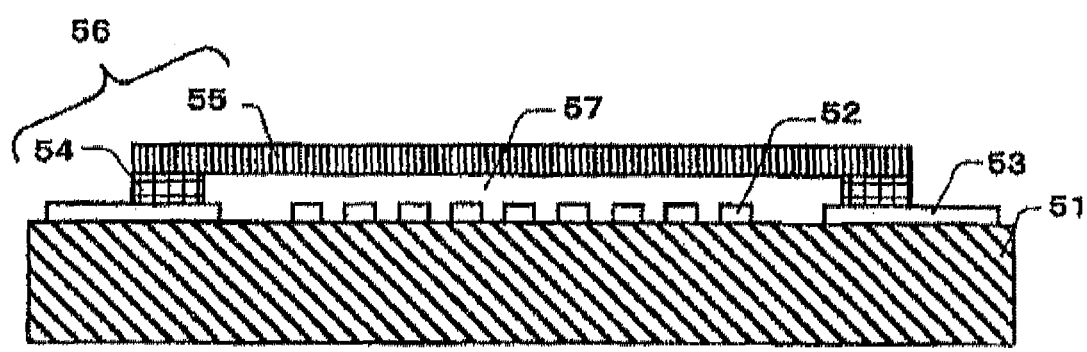
FIG. 8 A cross-sectional view showing an example of a conventional surface acoustic wave device.

Next, as shown in FIG. 6E, through holes 15 are formed in the protective cover 6 (through hole forming process). Specifically, from the state of FIG. 6D, an exposure and development step is used to form the lid member 5 covering the surface acoustic wave element region by the second resist 17. Simultaneously with that, from the state of FIG. 6D, an exposure and development step is used to form the through holes 15 at predetermined positions of the second resist 17. After that, the frame member 4 and the lid member 5 are joined by heating to form the protective cover 6 (joining step). The heating temperature for joining may be set to, for example, about 150° C. in a case where an epoxy-based resin is used for the frame member 4 and the lid member 5. By this protective cover 6, the holding space (vibration space) can be secured, and the IDT 2 can be sealed, therefore oxidation etc. of the IDT 2 can be prevented.

By such a step A to step C', a surface acoustic wave device can be fabricated. By fabrication by such steps, it is not necessary to use a sacrificial layer 7. Therefore, etchant or residual products of etching will no longer remain in the internal portion (holding space) of the formed hollow structure when removing the sacrificial layer 7a as in the case where the sacrificial layer 7a shown in FIG. 5 is used, so deterioration of electric characteristics of the surface acoustic wave device can be prevented. As a result, the reliability of the surface acoustic wave device can be improved more. Further, since the holding space can be formed without using the sacrificial layer 7a, the steps which were necessary for formation and removal of the sacrificial layer 7a become unnecessary, so the number of steps for forming the holding space can be decreased and the productivity can be raised.

Further, as another method, a method of forming the frame member 4, then adhering the lid member 5 formed on another base member so as to form the protective cover 6 can be considered. However, in comparison with this case, the strict adhesion accuracy which is necessary for adhesion of the frame member 4 and the lid member 5 is not required and a further increase of the number of steps does not occur.

In the example shown in FIG. 6, the frame member 4 is formed by film formation by for example the spin coating method, then patterning. However, it may also be formed by placing the frame member 4 on one major surface of the piezoelectric substrate 1.

When using a film-like member as the first resist forming the frame member 4, a frame member 4 having a uniform thickness can be formed by just placing the film, therefore the film-shaped second resist 17 can be placed on the frame member 4 with no clearance. For this reason, it becomes possible to reliably seal the space above the surface acoustic wave element region by a simple process. Further, when the film-shaped first resist and second resist 17 are made by the same material, the two can be integrally joined when heating the frame member 4 and the lid member 5 to join them, therefore the joint interface thereof is removed as well, so the adhesion strength and air-tightness can be improved, and a highly reliable surface acoustic wave device can be fabricated. In particular, when using an epoxy-based resin as the material of the first and second resists and heating within a range of 100° C. to 200° C., polymerization is promoted more, therefore the adhesion strength and air-tightness are improved, so this is preferred.

Next, still another example of the method of production of a surface acoustic wave device of the present invention will be explained based on FIG. 7.

FIGS. 7A to 7H are cross-sectional views of the steps after FIG. 6E which show still another example of the method of production of a surface acoustic wave device of the present invention.

The method of production shown in FIG. 7 forms a substantially columnar outside connection-use electrode 12 (simply sometimes referred to as a "columnar section 12") on the end portion 3a of the connecting line 3, exposes the upper end portion of the outside connection-use electrode 12, and closes the through holes 15 and seals the protective cover 6 and outside connection-use electrode 12 by a resin. Next, each step will be specifically explained.

(Step D: Electrode Forming Step 1)

First, as shown in FIG. 7A, from the state shown in FIG. 6E, a plating use underlayer 23 is formed covering the surface acoustic wave element region over which the protective cover 6 provided with the through holes 15 is formed.

The plating use underlayer 23 is used for causing the substantially columnar outside connection-use electrode 12 to electrically precipitate or chemically precipitate. A portion of the plating use underlayer 23 functions as a portion of the remaining electrodes in the later steps as well. For this reason, preferably use is made of the same material as that of the substantially columnar outside connection-use electrode 12. Note that, in these, generally Cu is utilized, but if considering the close adhesion of the Cu and AlCu interconnects, preferably an adhesion layer of Cr or Ti is interposed.

The plating use underlayer 23 is formed on the entire surface of the piezoelectric substrate 1 including the region for forming the substantially columnar outside connection-use electrode 12 by using for example Ti—Cu. By such a plating use underlayer 23, it is possible to form the copper or other metal which will become the outside connection-use electrode 12 thick by for example an electroplating method via the plating use underlayer 23. Note that, when forming a plating use underlayer 23 on the entire top surface of the piezoelectric substrate 1 including the protective cover 6, it is sufficient that the plating use underlayer 23 be formed to an extent enabling the columnar part 12 of the outside connection-use electrode to be reliably formed at least at the position for forming the outside connection-use electrode 12.

Particularly, in a case when forming such a plating use underlayer 23 by a flash plating method, it is not necessary to form an interconnect pattern for making current flow only in the plating formation portion, therefore reduction of size of a chip becomes possible.

Note that, when forming the plating use underlayer 23 in this way, invasion of a plating ingredient metal into the holding space 7 from the through holes 15 and deposition onto the region in which the IDT 2 is formed are prevented.

For this purpose, for example, the size of the through holes 15 may be reduced, the through holes 15 may be provided at positions not facing the IDT 2, or an insulation layer (not shown) may be provided on the top surface of the protective cover 6 to close the through holes, then the plating use underlayer 23 may be formed.

(Step E: Electrode Forming Step 2)

Next, as shown in FIG. 7B, on the plating use underlayer 23, a plating use resist 24 having an opening 26 above the connecting line 3 located on outside the protective cover 6 is formed.

The plating use resist 24 is formed by, for example, spin coating or another technique. Note that, according to the viscosity of the used resist or number of times of coating by spin coating, it becomes possible to control the thickness of the resist from several micrometers to several hundreds of micrometers. Further, for the opening 26 of the resist 24, preferably a general photolithography method is utilized.

(Step F: Electrode Forming Step 3)

Next, as shown in FIG. 7C, on the plating use underlayer 23 exposed in the opening 26, the substantially columnar outside connection-use electrode 12 is formed by the plating method.

The substantially columnar outside connection-use electrode 12 may be formed by an electroplating method, electroless plating method, stud bump method, etc. as well. The electroplating method is preferred. This is because the degree of freedom of the height of the substantially columnar outside connection-use electrode 12 is high, and the adhesion with the underlying film is good. In particular, the thickness of plating depends upon the plating treatment time. Therefore, when forming a thickness exceeding 30 μm, the electroplating method with its fast growth speed is preferred. As the material forming the outside connection-use electrode 12, use can be made of, for example, solder, Cu, Au, or Ni. In particular, when using Cu or solder, the step becomes cheap, so this is preferred.

Further, the outside connection-use electrode 12 is formed so that its top surface is located at a position higher than the top surface of the protective cover 6. This is for exposing the top surface of the outside connection-use electrode 12 in a state when the protective cover 6 is covered by the sealing resin 11 when removing the upper portion of the sealing resin 11 in the later process.

(Step G: Electrode Forming Step 4)

Next, as shown in FIG. 7D, the substantially columnar outside connection-use electrode 12 is left and the plating use resist 24 and the plating use underlayer 23 are removed. The plating use resist 24 can be removed by acetone, IPA, or another organic solvent or dimethyl sulfoxide or another alkali organic solvent. Further, the Cu of the plating use underlayer 23 can be removed by a mixture of iron (II) chloride or phosphoric acid with a hydrogen peroxide solution. Further, the Ti of the plating use underlayer 23 can be removed by a mixture of a dilute fluoric acid or ammonia with a hydrogen peroxide solution. Among these, as one damaging the $SiO_2$ film and AlCu interconnects formed at the lower layer of the plating use underlayer 23 only a little, preferably use is made of a mixture of ammonia with the hydrogen peroxide solution for peeling off the Ti.

Note that, when removing the plating use resist 24 to expose the outside connection-use electrode 12, then removing the plating use underlayer 23 as explained above, the plating use underlayer 23 located at the lower surface of the outside connection-use electrode 12 is partially removed at its outer edge portion, but remains at the portions other than this. Namely, at the time of removal of the plating use underlayer 23, the columnar part 12 is not removed.

The electrode forming step is comprised by such a step D to step G.

(Step H: Sealing Step 1)

Next, as shown in FIG. 7E, on the surface acoustic wave element region, a sealing resin 11 is formed closing the through holes 15 and covering the protective cover 6 and the substantially columnar outside connection-use electrode 12.

As the sealing resin 11 material, an epoxy-based resin is preferred. In particular, use is made of one having a linear expansion coefficient near that of the piezoelectric substrate 1, use is made of one having a low modulus of elasticity, or use is made of one with a little stress applied to the piezoelectric substrate 1. Further, when air bubbles are mixed into the sealing resin 11, this becomes a cause of the steam explosion, therefore printing by a vacuum printing method is preferred as well. Note that, the thickness of the resin is preferably set to an extent where the substantially columnar outside connection-use electrode 12 is covered.

When the diameter of the through holes 15 is several micrometers to about 50 μm, as the resin material of the sealing resin 11, preferably use is made of one having a viscosity of about 3000 to 5000 cp. Due to this, the resin material becomes harder to enter into the through holes 15 and entry of the sealing resin 11 into the holding space 7 can be suppressed.

(Step I: Sealing Step 2)

Next, as shown in FIG. 7F, the top surface of the sealing resin 11 is grounded to expose the substantially columnar outside connection-use electrode 12.

Specifically, the top surface of the sealing resin 11 is ground by a grinder by using a grinding cutter until the substantially columnar outside connection-use electrode 12 is exposed. In order to connect a later explained outside connection-use terminal electrode 10 and the substantially columnar outside connection-use electrode 12 well, the surface may be finished by buff grinding etc.

The sealing step is comprised by these step H and step I.

Preferably, at a point of time when the sealing resin 11 is obtained in this way, a protective layer 22 is formed as shown in FIG. 7G.

The protective layer 22 is provided for the purpose of improving the shock resistance of the surface acoustic wave device at the time of fabrication and after fabrication. Namely, by providing the protective layer 22, cracks, chipping, or other defects of the surface acoustic wave devices are suppressed, and improvement of the production yield and improvement of reliability are realized. Further, the bottom surface of the piezoelectric substrate 1 is protected in this structure, therefore entry of moisture from the interface between the piezoelectric substrate 1 and the sealing resin 11 is prevented, and a surface acoustic wave device improved in air-tightness, and moisture resistance can be realized.

The protective layer 22 is preferably formed by a material having a thermal expansion coefficient substantially the same as that of the sealing resin 11. In such case, stress by the sealing resin 11 which occurs when only the sealing resin 11 is provided is relieved, therefore warping of the piezoelectric substrate 1 due to stress can be suppressed. Namely, a surface acoustic wave device with a higher reliability can be realized.

In particular, when using an epoxy-based resin material, the thermal expansion coefficient can be controlled by adding $SiO_2$ or another filler. Since the moisture permeability is high and absorption is high, stress applied to the piezoelectric substrate 1 can be cancelled by the top and bottom surfaces, and entry of moisture to the surface acoustic wave device can be suppressed, so this is preferred.

Further, it is also possible form such a protective layer 22 at any timing after forming the back surface electrode 16. However, if the formed after forming the sealing resin 11 on the top surface of the piezoelectric substrate 1 as explained above, the stress applied to the piezoelectric substrate 1 can be cancelled by the difference of thermal expansion coefficient between the piezoelectric substrate 1 and the sealing resin 11, and a surface acoustic wave device with a higher reliability can be realized, so this is preferred.

(Step J)

Next, as shown in FIG. 7H, the outside connection-use terminal electrode 10 is formed on the top surface of the substantially columnar outside connection-use electrode 12.

For the outside connection-use terminal electrode 10, a bump may be formed by using PbSn solder, lead-free solder, AuSn solder, AuGe solder, or another solder or a thin membrane may be formed by a material having electric conductivity to form a flat pad. For example, by screen printing solder paste on the top portion of the substantially columnar outside connection-use electrode 12 and re-flowing it, the outside connection-use terminal electrode 10 can be formed.

By using such a step D to step J, the outside connection-use terminal electrode 10 is formed on the substantially columnar outside connection-use electrode 12 exposed at the top surface of the sealing resin 11, whereby a surface mountable surface acoustic wave device can be provided. Further, such a surface acoustic wave device can be formed at a wafer level, therefore the surface acoustic wave device can be provided without going through a complex process. Further, the material of forming the outside connection-use electrode 12 can be selected in accordance with the mounting substrate for mounting the surface acoustic wave device, therefore the joint reliability with the mounting substrate can be improved.

Further, when applying a surface acoustic wave device fabricated by the method of production of the surface acoustic wave device of the present invention to a branching filter, the substantially columnar outside connection-use electrode 12 can be used as a heat radiation electrode as well. By arranging the substantially columnar outside connection-use electrode 12 in the vicinity of a heat generation portion in the IDT 2, a surface acoustic wave device excellent in heat radiation property can be provided. Further, by adjusting the arrangement, number, and diameter of this substantially columnar outside connection-use electrode 12, the heat radiation property can be improved.

As described above, according to the method of production of the surface acoustic wave device of the present invention, the surface acoustic wave device can be formed at the wafer level, therefore it becomes unnecessary to individually assemble surface acoustic wave elements formed as chips. For this reason, a small processing capability die bonder, seam welding machine, or other assembly device becomes unnecessary, greater simplification of the fabrication process can be achieved, and the mass production ability can be raised.

Further, the surface acoustic wave device fabricated according to the method of production of the surface acoustic wave device of the present invention as described above enables realization of a smaller and lower profile surface acoustic wave device, and a surface acoustic wave device with a higher reliability can be realized.

Note that, preferably, at the step G, as shown in FIG. 7D, the substantially columnar outside connection-use electrode 12 is formed so as to become higher than the protective cover 6 and, at the step I, as shown in FIG. 7F, the outside connection-use electrode 12 is exposed at the top surface of the sealing resin 11 in a state where the protective cover 6 is covered by the sealing resin 11. By performing this, in comparison with the height from the top of the surface acoustic wave element region to the uppermost portion of the protective cover 6, the height from the top of the surface acoustic wave element region to the uppermost portion of the substantially columnar outside connection-use electrode 12 can be made larger. Due to this, the air-tightness of the protective cover 6 for securing the vibration space of the excited surface acoustic wave of the surface acoustic wave device can be sufficiently secured.

Further, at the step E, preferably the plating use resist 24 is formed by repeatedly coating and curing a resist material several times. By forming the plating use resist 24 divided into several steps in this way, it is possible to use a resist material appropriately adjusted considering the coatability, handling ability, etc. to form a plating use resist 24 with a desired thickness so as to form a plating use resist 24 with a desired thickness, therefore the productivity can be raised. Further, the plating use resist 24 can be formed to a desired thickness, therefore it becomes possible to form the substantially columnar outside connection-use electrode 12 with a desired height.

In particular, when coating and curing the resist material up to almost the same height as that of the uppermost portion of the protective cover 6, then further repeating coating and curing so as to obtain a desired thickness, the top surface of the plating use resist 24 can be made flat, so this is preferred.

Next, still another example of the method of production of the surface acoustic wave device of the present invention will be explained based on FIG. 9.

FIGS. 9A to 9E are cross-sectional views of the steps after FIG. 6E which show still another example of the method of production of the surface acoustic wave device of the present invention. Portions similar to FIG. 7 are assigned the same notations and overlapping explanations are omitted.

(Step K: Sealing Step 1)

As shown in FIG. 9A, from the state shown in FIG. 6E, the sealing resin 11 is formed covering the surface acoustic wave element region in which the protective cover 6 provided with the through holes 15 is formed.

The sealing resin 11 is formed so as to close the through holes 15 and thicker in comparison with the height of the protective cover 6 from the piezoelectric substrate 1. Note that, when coating a resin solution, then curing it to obtain the sealing resin 11, in order to close the through holes 15, a resin solution having a viscosity by which the resin will not flow into the through holes 15 at the time of baking may be used. Further, as shown in FIG. 9A, when providing the sealing resin 11, preferably the protective layer 22 having almost the same thermal expansion coefficient as that of the material constituting the sealing resin 11 is provided on the back surface of the piezoelectric substrate 1.

(Step L: Sealing Step 2, Electrode Forming Step 1)

Next, as shown in FIG. 9B, a portion of the sealing resin 11 located above the end portion 3a of the connecting line 3 is removed to expose the connecting line 3. In order to remove a portion of the sealing resin 11, the surface may be patterned by a usual photolithography technique or patterned by lasering. When lasering to remove a portion of the sealing resin 11, the connecting line 3 comprised of the electrically conductive material functions as a stopping layer, therefore the lasering can be stopped in a stage where the connecting line 3 is exposed. Note that, as the laser, preferably use is made of a $CO_2$, UV YAG, excimer laser, or the like.

(Step M: Electrode Forming Step 2)

Next, as shown in FIG. 9C, the outside connection-use electrode 12 is formed by an electroplating method.

(Step I': Sealing Step 3)

Next, as shown in FIG. 9D, in the same way as FIG. 7F, the sealing resin 11 is ground so that the outside connection-use electrode 12 is exposed at the top surface of the sealing resin 11.

(Step J')

Next, as shown in FIG. 9E, in the same way as FIG. 7G, the outside connection-use terminal electrode 10 can be formed on the outside connection-use electrode 12 exposed at the top surface of the sealing resin 11 to form the surface acoustic wave device of the present invention.

Note that, in FIG. 9, the sealing step is comprised of the step K, step L, and step I', and the electrode forming step is comprised of the step L and step M. Further, as explained above, even when the electrode forming step is provided in the middle of the sealing step, no problem occurs.

By forming the device as shown in FIG. 9, even in the case where there are the through holes 15, the IDT 2 in the holding space 7 can be sealed without exerting an influence upon the IDT 2. Further, the IDT 2 can be connected to the outside of the holding space and a surface acoustic wave device which can be surface mounted in a state where the IDT 2 is sealed can be provided by a simple method of production.

The invention claimed is:
1. A surface acoustic wave device, comprising:
   a piezoelectric substrate propagating a surface acoustic wave;
   an IDT formed on one major surface of the piezoelectric substrate and comprising at least one comb-shaped electrode with a plurality of electrode fingers extending in a longitudinal direction which is perpendicular to the direction of propagation of the surface acoustic wave; and
   a protective cover, at least a part of which is formed of a photocurable material comprising an acid generator containing fluorine, covering a formation region of the IDT on the one major surface so as to form a hollow accommodating space with the one major surface, and comprising one or more through holes for communicating the accommodating space with outside.

2. The surface acoustic wave device as set forth in claim 1, wherein the protective cover comprises a frame surrounding the IDT and a plate-shaped lid on the frame.

3. The surface acoustic wave device as set forth in claim 2, wherein the protective cover comprises a frame member forming the frame and a film-shaped lid member placed on the frame member in order to form the lid, and the frame member and the film-shaped lid member are in contact with each other.

4. The surface acoustic wave device as set forth in claim 1, further comprising:
   a connecting line on the one major surface for electrically connecting the IDT and an external circuit, the connecting line being connected to the IDT and comprising an end portion thereof outside of the protective cover, an outside connection-use electrode which is a substantially columnar and is on the end portion of the connecting line, and a sealing resin for sealing the protective cover and the outside connection-use electrode by closing the through holes while having an upper end portion of the outside connection-use electrode exposed.

5. The surface acoustic wave device as set forth in claim 2, wherein the IDT comprising a narrow pitch region in which an interval of the electrode fingers is narrower than the interval of the other electrode fingers, and the one or more through holes comprise a hole at a position facing the narrow pitch region of the IDT in the lid.

6. The surface acoustic wave device as set forth in claim 3, wherein the frame member comprises a clearance in a portion of the shape surrounding the IDT in a plan view, and the one or more through holes comprises the clearance.

7. The surface acoustic wave device as set forth in claim 2, wherein a protective film covers the IDT and is on the one major surface of the piezoelectric substrate, the frame is formed of the photocurable material, and the frame is on the protective film.

8. The surface acoustic wave device as set forth in claim 6, wherein a diameter of the clearance in a direction perpendicular to the one major surface is the same as the thickness of the frame in the direction perpendicular to the one major surface.

9. The surface acoustic wave device as set forth in claim 6, wherein the clearance is plural and form pairs at positions facing each other in a plan view of the frame member.

10. The surface acoustic wave device as set forth in claim 4, wherein a height of the outside connection-use electrode above the one major surface of the piezoelectric substrate is higher than the height of the protective cover.

* * * * *